United States Patent
Jing et al.

(10) Patent No.: US 9,923,051 B1
(45) Date of Patent: Mar. 20, 2018

(54) SUBSTRATE NOISE ISOLATION STRUCTURES FOR SEMICONDUCTOR DEVICES

(71) Applicant: Xilinx, Inc., San Jose, CA (US)

(72) Inventors: Jing Jing, San Jose, CA (US); Shuxian Wu, San Jose, CA (US); Jane Sowards, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/272,292

(22) Filed: Sep. 21, 2016

(51) Int. Cl.
| H01L 29/06 | (2006.01) |
| H01L 21/3205 | (2006.01) |
| H01L 21/768 | (2006.01) |
| H01L 23/48 | (2006.01) |
| H01L 29/78 | (2006.01) |
| H01L 21/761 | (2006.01) |

(52) U.S. Cl.
CPC ........ H01L 29/0623 (2013.01); H01L 21/761 (2013.01)

(58) Field of Classification Search
None
See application file for complete search history.

(56) References Cited

U.S. PATENT DOCUMENTS

| 7,541,652 B1 | 6/2009 | Abughazaleh | |
| 2010/0289110 A1* | 11/2010 | Tarui | H01L 29/0619 257/490 |
| 2011/0233717 A1 | 9/2011 | Jensen et al. | |
| 2015/0021713 A1* | 1/2015 | Cheng | H01L 29/7851 257/409 |
| 2015/0076557 A1* | 3/2015 | Salcedo | H01L 29/7436 257/173 |
| 2015/0380483 A1* | 12/2015 | Mallikarjunaswamy | H01L 29/0619 257/494 |

* cited by examiner

Primary Examiner — Khaja Ahmad
(74) Attorney, Agent, or Firm — Robert M. Brush

(57) ABSTRACT

An example a semiconductor device includes a first circuit and a second circuit formed in a semiconductor substrate. The semiconductor device further includes a first guard structure formed in the semiconductor substrate and disposed between the first circuit and the second circuit, the first guard structure including first discontinuous pairs of n+ and p+ diffusions disposed along a first axis. The semiconductor device further includes a second guard structure formed in the semiconductor substrate and disposed between the first circuit and the second circuit, the second guard structure including second discontinuous pairs of n+ and p+ diffusions disposed along the first axis, the second discontinuous pairs of n+ and p+ diffusions being staggered with respect to the first discontinuous pairs of n+ and p+ diffusions.

20 Claims, 7 Drawing Sheets p+ diffusion
n+ diffusion

SUBSTRATE NOISE ISOLATION STRUCTURES FOR SEMICONDUCTOR DEVICES

TECHNICAL FIELD

Examples of the present disclosure generally relate to electronic circuits and, in particular, to substrate noise isolation structures for semiconductor devices.

BACKGROUND

Silicon integrated circuits (ICs) suffer from substrate coupling because the substrates are not good insulators. Coupling electric signals between circuits through the semiconductor substrate can cause noise interference and affect the normal function of the circuits. Thus, reducing unwanted substrate noise is important to ensure the normal function and performance of ICs with silicon substrates in both bulk and Fin Field Effect Transistor (FinFET) technologies.

Various techniques have been employed in ICs to reduce substrate coupling. One technique is to add high-resistance paths in the substrate. Another technique is to add guard rings around sensitive circuits. For bulk complementary metal oxide semiconductor (CMOS) technologies, the guard rings are continuous, which forms good isolation between circuits. For FinFET technologies, however, the guard rings are no longer continuous in the vertical direction and the oxide definition (OD) width is limited by the maximum Fin numbers in each FinFET technology. In this case, substrate noise can leak through the gaps in the guard rings and cause unwanted noise and interference. The inventors have found the substrate noise to be 30 dB higher in cases of a discontinuous guard ring. As technology advances, the substrate coupling becomes more severe, since the distance between circuits becomes smaller.

SUMMARY

Techniques for providing substrate noise isolation structures for semiconductor devices. In an example, a semiconductor device includes a first circuit and a second circuit formed in a semiconductor substrate. The semiconductor device further includes a first guard structure formed in the semiconductor substrate and disposed between the first circuit and the second circuit, the first guard structure including first discontinuous pairs of n+ and p+ diffusions disposed along a first axis. The semiconductor device further includes a second guard structure formed in the semiconductor substrate and disposed between the first circuit and the second circuit, the second guard structure including second discontinuous pairs of n+ and p+ diffusions disposed along the first axis, the second discontinuous pairs of n+ and p+ diffusions being staggered with respect to the first discontinuous pairs of n+ and p+ diffusions.

In another example, a method of manufacturing a semiconductor device includes: forming a first circuit and a second circuit in a semiconductor substrate; forming a first guard structure in the semiconductor substrate between the first circuit and the second circuit, the first guard structure including first discontinuous pairs of n+ and p+ diffusions disposed along a first axis; and forming a second guard structure in the semiconductor substrate between the first circuit and the second circuit, the second guard structure including second discontinuous pairs of n+ and p+ diffusions disposed along the first axis, the second discontinuous pairs of n+ and p+ diffusions being staggered with respect to the first discontinuous pairs of n+ and p+ diffusions.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
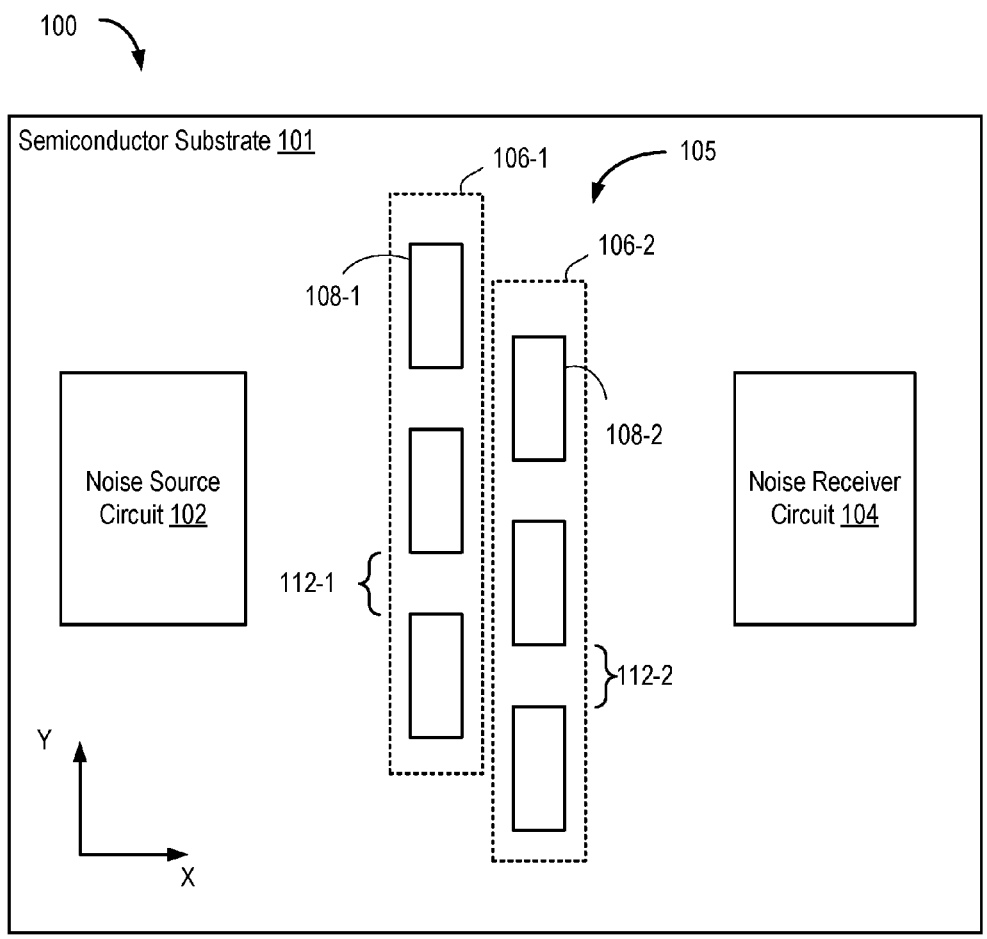
FIG. 1 is a plan view of a semiconductor device according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for substrate noise isolation structures for semiconductor devices are provided. The disclosed techniques greatly reduce substrate noise induced by circuits in integrated circuits (ICs) that include Fin Field Effect Transistors (FinFETs). In an example, multiple oxide definition (OD) guard rings of N+/P+ types with a shifted pattern are used to implement a substrate noise isolation scheme. The isolation scheme can be placed between circuit blocks as a wall, or can surround circuit blocks, to suppress substrate noise coupling. These and further aspects are described below with respect to the drawings.

FIG. 1 is a plan view of a semiconductor device 100 according to an example. The semiconductor device 100 includes a semiconductor substrate 101 (e.g., silicon), a noise source circuit 102, a noise receiver circuit 104, and a substrate noise isolation structure 105. The noise source circuit 102 and the noise receiver circuit 104 each include a plurality of transistors. In an example, at least one of the noise source circuit 102 and the noise receiver circuit 104 includes FinFETs. The metal layers that interconnect the transistors to form the circuits 102, 104 are omitted from FIG. 1 for clarity.

The substrate noise isolation structure 105 is disposed between the noise source circuit 102 and the noise receiver circuit 104. In the present example, the substrate noise isolation structure 105 forms a wall between the circuits 102, 104. In other examples (described below), the substrate noise isolation structure 105 can be implemented as one or more rings surrounding one of the circuits 102, 104. The substrate noise isolation structure 105 is configured to reduce substrate coupling between the circuits 102, 104. For example, as shown in FIG. 1, the noise source circuit 102 is a source of substrate noise on the semiconductor device 100, and the noise receiver circuit 104 is sensitive to substrate noise on the semiconductor device 100. The substrate noise isolation structure 105 reduces substrate noise at the noise receiver circuit 104 that is generated by the noise source circuit 102.

The substrate noise isolation structure 105 includes a plurality of guard structures 106. In the example, guard structures 106-1 and 106-2 are formed in the semiconductor substrate 101. Each guard structure 106 comprises a column of discrete diffusion regions extending along a Y-axis of an X-Y plane of the semiconductor substrate 101. As shown, the diffusion regions of the guard structures 106 are discontinuous along the Y-axis. For example, for FinFET technologies, the oxide definition (OD) width is limited by the maximum Fin numbers in each FinFET technology. Thus, it is not possible to form continuous diffusion regions along the axis of the OD width (e.g., the Y-axis).

As shown in FIG. 1, the guard structure 106-1 includes diffusion regions 108-1 separated by gaps 112-1. The guard structure 106-2 includes diffusion regions 108-2 separated by gaps 112-2. The guard structures 106-1 and 106-2 are parallel to each other along the Y-axis and are staggered with respect to each other. That is, the gaps 112-1 are not aligned with the gaps 112-2. Stated differently, the diffusion regions 108-2 of the guard structure 106-2 block the gaps 112-1 between the diffusion regions 108-1 of the guard structure 106-1 along the X-axis. Thus, there is no path parallel to the X-axis through the substrate noise isolation structure 105 between the circuits 102, 104. In this manner, the staggered guard structures reduce substrate coupling between the circuits 102, 104. While two staggered guard structures 106-1 and 106-2 are shown, a plurality of guard structures 106 can be formed in the semiconductor substrate 101 between the circuits 102, 104 and staggered with respect to each other.

Figure 2A:
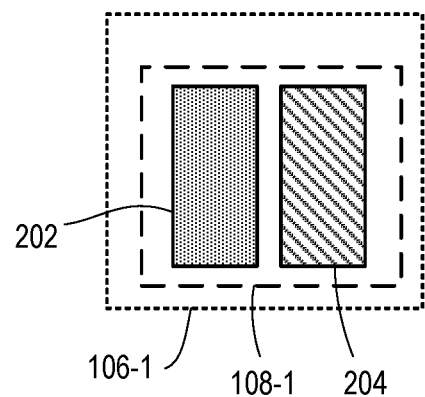
FIGS. 2A-B are plan views depicting a diffusion region of a guard structure according to examples.

FIG. 2A is a plan view depicting a diffusion region 108-1 of the guard structure 106-1 according to an example. Any diffusion region 108 of the guard structures 106 is configured similar to that shown in FIG. 2A. As shown in FIG. 2A, the diffusion region 108-1 includes an n+ diffusion 202 and a p+ diffusion 204. The n+ diffusion 202 and the p+ diffusion 204 are referred to as an n+/p+ pair of diffusion regions. The n+ diffusion 202 comprises a heavily doped region of the semiconductor substrate 101 that has a larger electron concentration than hole concentration and an donor impurity concentration N that satisfies the inequality $Na^3 \gg 1$, where a is the Bohr radius of the impurity state. The p+ diffusion 204 comprises a heavily doped region of the semiconductor substrate 101 that has a larger hole concentration than electron concentration and a donor impurity concentration N that satisfies the inequality $Na^3 \gg 1$. By including both n+ and p+ diffusions, the guard structures 106 reduce both electron and hole coupling between the circuits 102, 104.

Figure 2B:
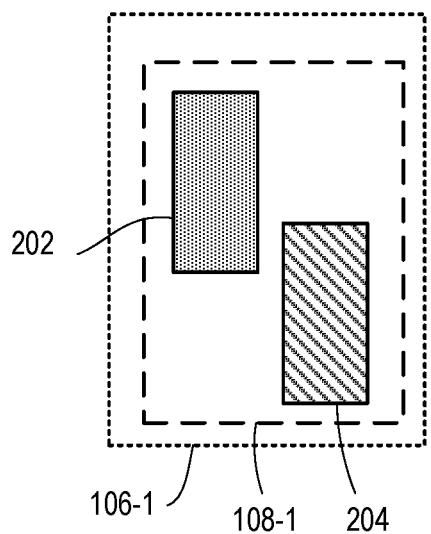

FIG. 2B is a plan view depicting a diffusion region 108-1 of the guard structure 106-1 according to another example. Any diffusion region 108 of the guard structures 106 is configured similar to that shown in FIG. 2B. As shown in FIG. 2B, the n+ diffusion 202 and the p+ diffusion 204 are staggered with respect to one another, rather than being substantially aligned as shown in FIG. 2A. Thus, the p+ diffusion regions can block the gaps between the n+ diffusion regions or vice versa.

Figure 3A:
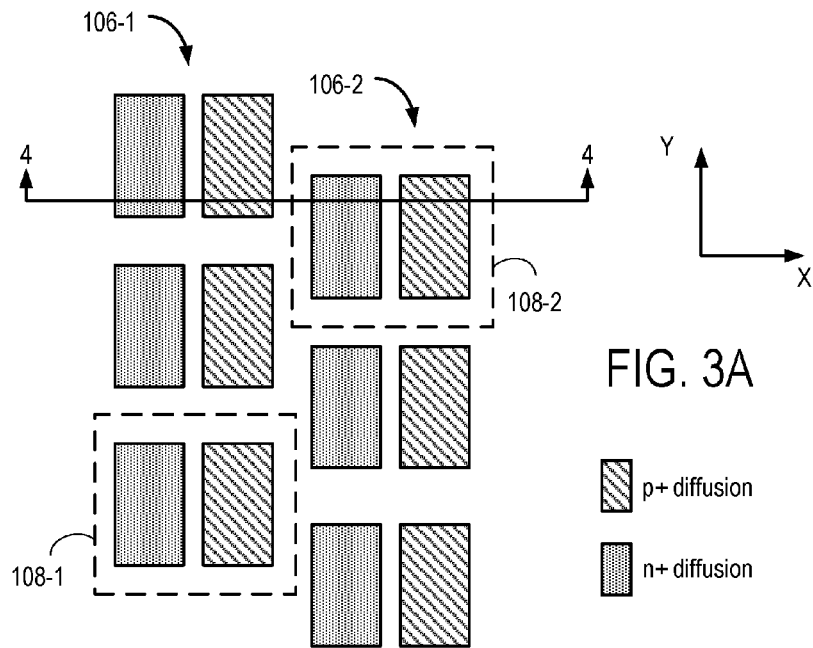
FIG. 3A is a plan view depicting a substrate noise isolation structure according to an example.

FIG. 3A is a plan view depicting the substrate noise isolation structure 105 according to an example. In the example of FIG. 3A, the substrate noise isolation structure 105 includes two guard structures 106-1 and 106-2. Each guard structure 106 comprises discontinuous pairs 108 of n+ and p+ diffusion regions along the Y-axis. The n+/p+ pairs 108-1 of the guard structure 106-1 are staggered with respect to the n+/p+ pairs 108-2 of the guard structure 106-2 so that there are no noise paths through the substrate noise isolation structure 105 parallel to the X-axis. That is, the gaps between the n+/p+ pairs 108-1 of the guard structure 106-1 are not aligned with the gaps between the n+/p+ pairs 108-2 of the guard structure 106-2.

Figure 3B:
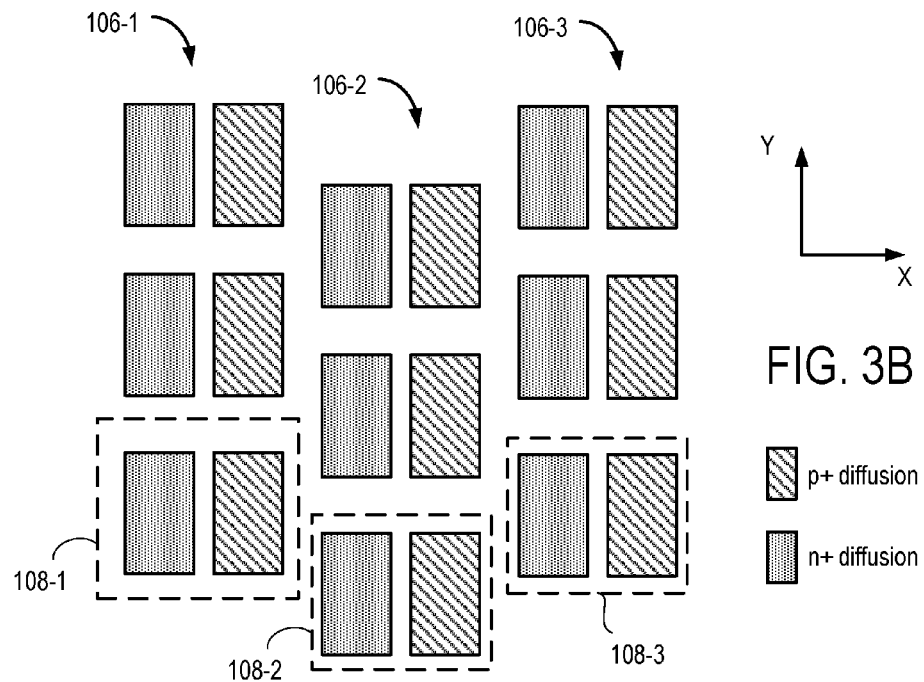
FIG. 3B is a plan view depicting a substrate noise isolation structure according to another example.

FIG. 3B is a plan view depicting the substrate noise isolation structure 105 according to another example. In the example of FIG. 3B, the substrate noise isolation structure 105 includes three guard structures 106-1, 106-2, and 106-3. Each guard structure 106 comprises discontinuous pairs 108 of n+ and p+ diffusion regions along the Y-axis. The n+/p+ pairs 108-1 of the guard structure 106-1 are staggered with respect to the n+/p+ pairs 108-2 of the guard structure 106-2. Likewise, the n+/p+ pairs 108-2 of the guard structure 106-2 are staggered with respect to the n+/p+ pairs 108-3 of the guard structure 106-3. One skilled in the art will appreciate from FIGS. 3A and 3B that any number of guard structures greater than one can be employed and disposed in a staggered fashion to form the substrate noise isolation structure 105.

Figure 3C:
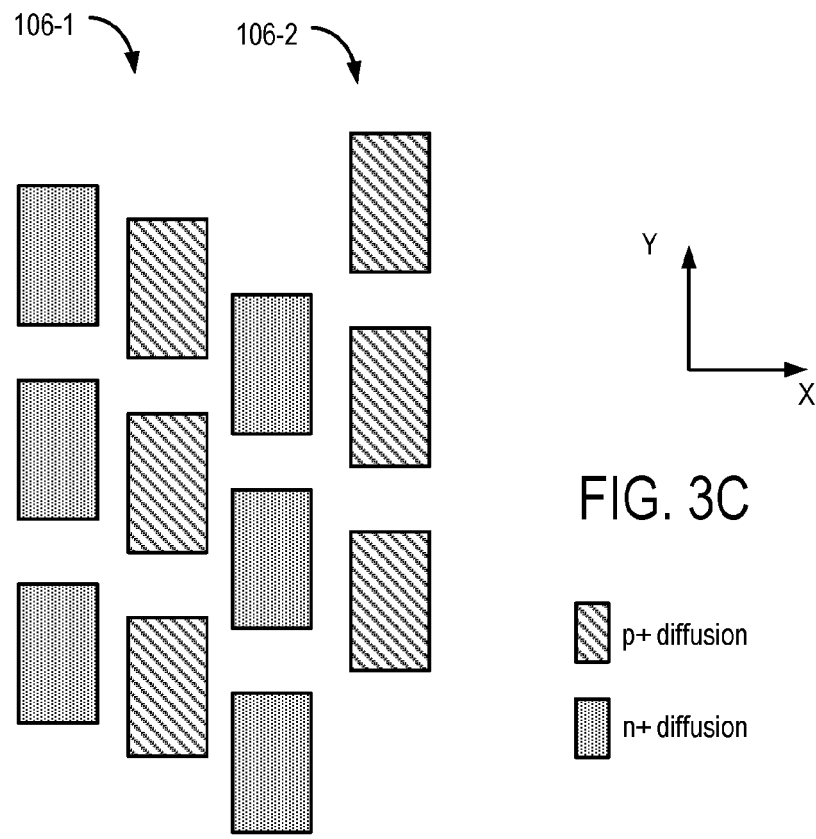
FIG. 3C is a plan view depicting a substrate noise isolation structure according to another example.

FIG. 3C is a plan view depicting the substrate noise isolation structure 105 according to yet another example. In the example of FIG. 3C, the substrate noise isolation structure 105 includes two guard structures 106-1 and 106-2. Each guard structure 106 comprises pairs of n+ and p+ diffusion regions along the Y-axis. The n+ and p+ diffusion regions are staggered with respect to each other in each guard structure 106. Further, the n+/p+ pairs of the guard structure 106-1 are staggered with respect to the n+/p+ pairs of the guard structure 106-2. Thus, the p+ diffusions in the guard structure 106-2 block the gaps of the p+ diffusions in the guard structure 106-1. The n+ diffusions of the guard structure 106-2 block the gaps of the n+ diffusions of the guard structure 106-1. Within a guard structure 106, the n+ and p+ diffusions are offset from another, rather than aligned with each other as shown in the examples of FIGS. 3A-B. This pattern can be repeated for any number of guard structures 106.

Figure 4:
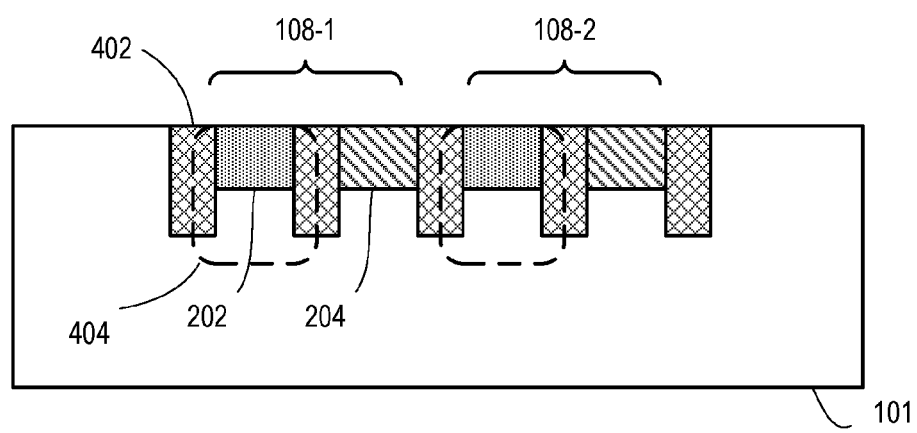
FIG. 4 is a cross-section of the substrate noise isolation structure of FIG. 3A taken along the line 4-4.

FIG. 4 is a cross-section of the substrate noise isolation structure 105 taken along the line 4-4 shown in FIG. 3A. As shown in FIG. 4A, the n+ and p+ diffusion regions 202, 204 are formed in the semiconductor substrate 101 using conventional techniques. The n+ and p+ diffusion regions 202, 204 of the n+/p+ pair 108-1 are separated by a shallow trench isolation (STI) 402. The diffusion regions of the n+/p+ pair 108-2 are also separated by an STI 402. The n+/p+ pairs 108-1, 108-2 are also separated by an STI 402. In an example, the p+ diffusion regions 204 are formed directly in the semiconductor substrate 101, which can be a p-type silicon substrate. The n+ diffusion regions 202 are formed in n-wells 404, which are formed in the semiconductor substrate 101. In other examples, the semiconductor substrate 101 can be an n-type substrate, the n+ diffusion regions 202 can be formed directly in the substrate, and the p+ diffusion regions 204 can be formed in p-wells.

Figure 5:
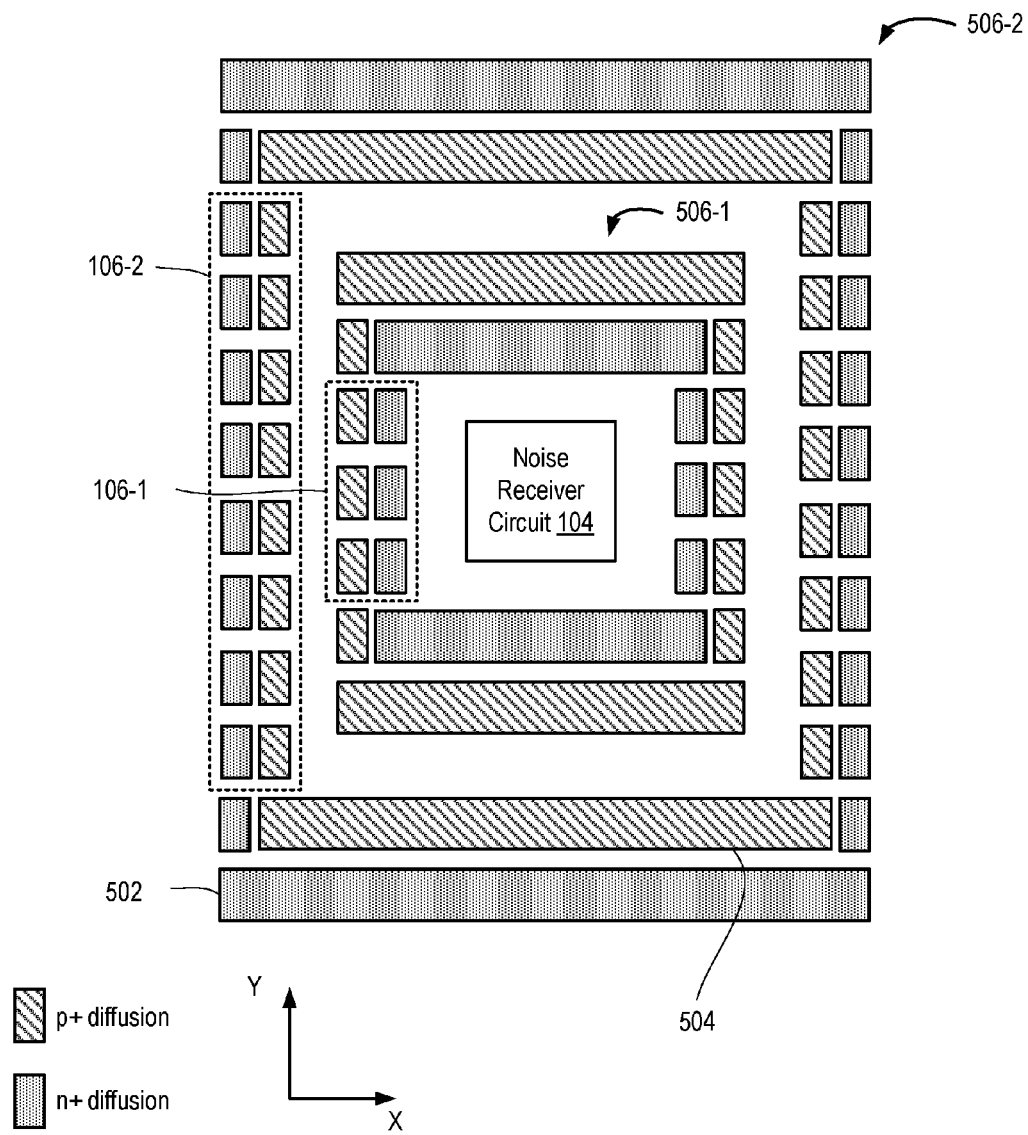
FIG. 5 is a plan view of a semiconductor device according to another example.

FIG. 5 is a plan view of the semiconductor device 100 according to another example. In FIG. 5, only the noise receiver circuit 104 is shown for purposes of clarity. In the present example, the substrate noise isolation structure 105 comprises a plurality of guard rings 506. The guard rings 506 surround the noise receiver circuit 104. In the example, a guard ring 506-1 and a guard ring 506-2 are shown. The guard ring 506-1 surrounds the noise receiver circuit 104. The guard ring 506-2 surrounds the noise receiver circuit 104 and the guard ring 506-1. Each guard ring 506 includes sides parallel to the Y-axis and sides parallel to the X-axis. The sides parallel to the X-axis are formed by continuous diffusion regions. For example, the guard ring 506-2 includes continuous n+ diffusion regions 502 and continuous p+ diffusion regions 504 that form the sides parallel to the X-axis. The sides parallel to the Y-axis are formed using discontinuous n+/p+ pairs, as described in the examples above. For example, the guard ring 506-2 includes discontinuous n+/p+ pairs 108-2, and the guard ring 506-1 includes discontinuous n+/p+ pairs 108-1. Along the Y-axis, the discontinuous n+/p+ pairs of one guard ring are staggered with respect to the discontinuous n+/p+ pairs of an adjacent guard ring. Thus, the n+/p+ pairs 108-1 are staggered with respect to the n+/p+ pairs 108-2 of the guard rings 506-1 and 506-2, respectively. While only two guard rings 506-1 and 506-2 are shown in the example of FIG. 5, the substrate noise isolation structure 105 can include any number of guard rings 506 surrounding the noise receiver circuit 104. While the guard rings 506 are shown surrounding the noise receiver circuit 104, in another example, the guard rings 506 surround the noise source circuit 102.

In the structure of FIG. 5, the n+/p+ diffusions in each pair are substantially aligned, as shown in FIGS. 2A, 3A, and 3B. In another example, the n+/p+ diffusions of each guard structure can be staggered similar to the staggering of the guard structures themselves (as shown in FIGS. 2B, 3C).

Figure 6:
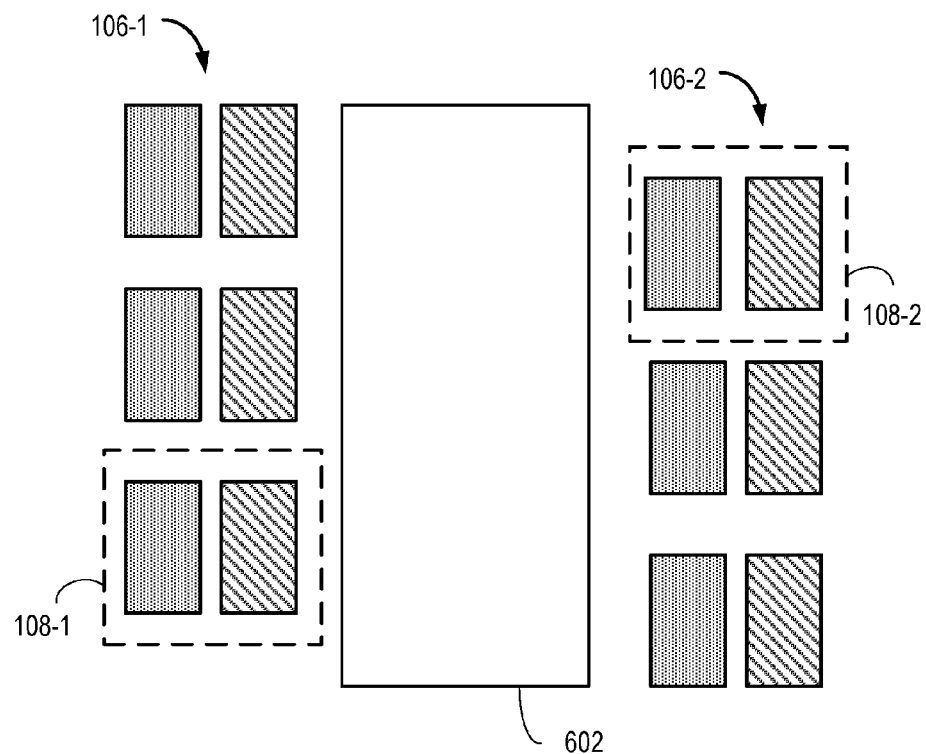
FIG. 6 is a plan view of a substrate noise isolation structure according to another example.
Figure 6:
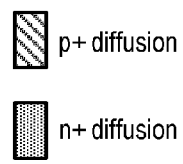
Figure 6:
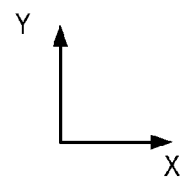

FIG. 6 is a plan view of the substrate noise isolation structure 105 according to another example. As shown in FIG. 6, the substrate noise isolation structure 105 includes two guard structures 106-1 and 106-2. Each guard structure 106 comprises discontinuous pairs 108 of n+ and p+ diffusion regions along the Y-axis. The n+/p+ pairs 108-1 of the guard structure 106-1 are staggered with respect to the n+/p+ pairs 108-2 of the guard structure 106-2. The guard structure 106-1 and the guard structure 106-2 are separated by another guard structure 602. In an example, the guard structure 602 is a moat, which can be a high resistance path through the semiconductor substrate 101. In another example, the guard structure 602 is a deep well, such as a deep n-well (DNW) formed in the semiconductor substrate 101. In another example, the guard structure 602 can be a combination of a moat and DNW. The example of FIG. 6 can be employed in any of the examples described above. For example, the guard rings 506 is FIG. 5 can be separated by a guard structure 602, which can be a moat, DNW, or the like.

In the structure of FIG. 6, the n+/p+ diffusions in each pair are substantially aligned, as shown in FIGS. 2A, 3A, and 3B. In another example, the n+/p+ diffusions of each guard structure can be staggered similar to the staggering of the guard structures themselves (as shown in FIGS. 2B, 3C).

Figure 7:
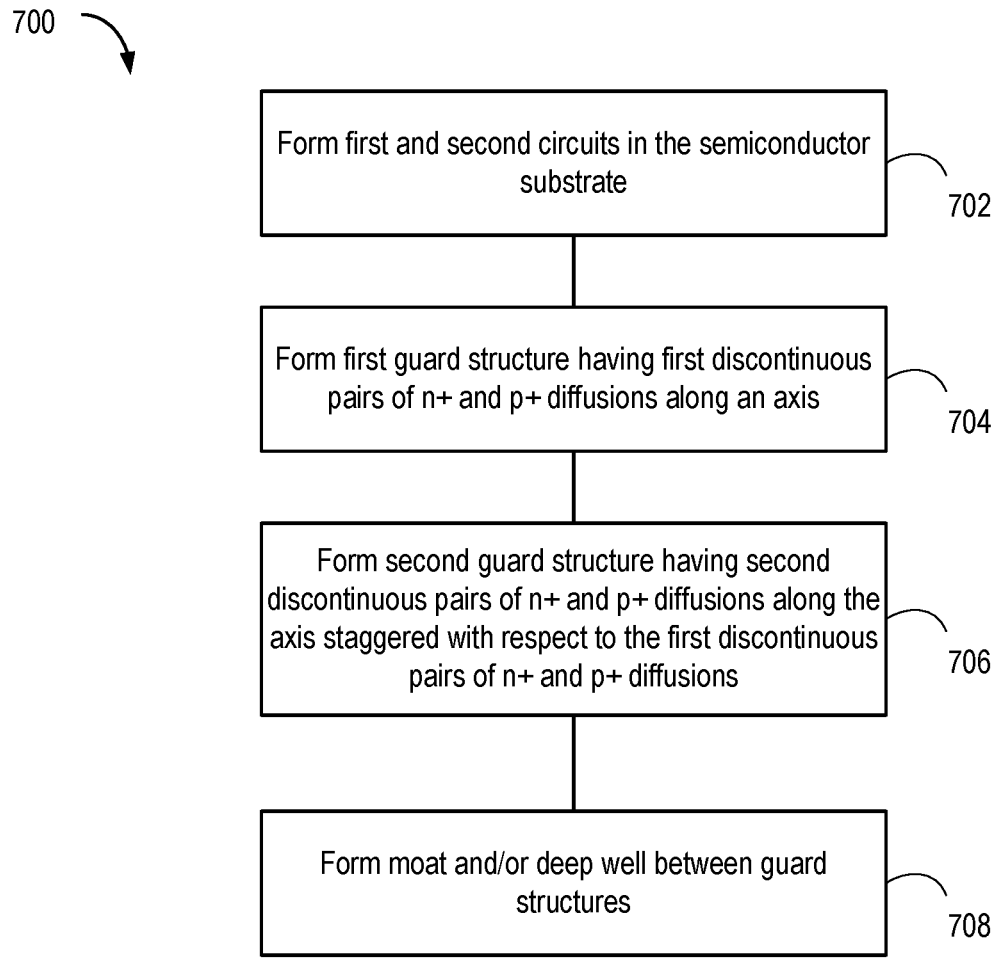
FIG. 7 is a flow diagram depicting a method of manufacturing a semiconductor device according to an example.

FIG. 7 is a flow diagram depicting a method 700 of manufacturing a semiconductor device according to an example. The method 700 begins at step 702, where first and second circuits are formed in the semiconductor substrate. In an example, the first circuit, the second circuit, or both include FinFETs. At step 704, a first guard structure is formed in the semiconductor substrate between the first circuit and the second circuit. The first guard structure includes first discontinuous pairs of n+ and p+ diffusions disposed along a first axis. At step 706, a second guard structure is formed in the semiconductor substrate between the first and second circuit. The second guard structure includes second discontinuous pairs of n+ and p+ diffusions disposed along the first axis and staggered with respect to the first pairs of n+ and p+ diffusions. In an example, the first and second guard structures are walls disposed between the first and second circuits. In another example, the first and second guard structures are sides of guard rings surrounding one of the first or second circuits. At step 708, a moat and/or deep well can be formed in the substrate between guard structures, as described above in FIG. 6.

Techniques for substrate noise isolation structures for semiconductor devices have been described. In general, a substrate noise isolation structure between two circuits includes at least two guard structures having discontinuous pairs of n+ and p+ diffusions. Between two guard structures, the discontinuous pairs of n+ and p+ diffusions are staggered so that the gaps therebetween are not aligned. The guard structures can be walls between the circuits or sides of guard rings surrounding one of the circuits. The described techniques provide for improved substrate noise isolation, particularly in technologies where continuous diffusion regions cannot be formed along at least one dimension of the substrate. For example, in FinFET technologies, the width of the OD is limited based on the maximum Fin number of the technology, which prevents the formation of continuous diffusion regions along one axis.

The examples described above are capable of different variations. In the examples above, the lengths along the X-axis of the n+ and p+ diffusions in the discrete n+/p+ pairs are substantially the same. In other examples, for a given n+/p+ diffusion pair, the length along the X-axis of the n+ diffusion can be different than the length along the X-axis of the p+ diffusion. In the examples described above, the widths along the Y-axis of the n+ and p+ diffusions in the discrete n+/p+ pairs are substantially the same (e.g., a maximum width as determined by the maximum OD width). In other examples, the width of one n+/p+ pair can be different than the width of another n+/p+ pair in the same guard structure or across different guard structures. In general, the width of an n+/p+ pair is at least as wide as a gap between n+/p+ pairs of an adjacent guard structure.

While the foregoing is directed to specific examples, other and further examples may be devised without departing from the basic scope thereof, and the scope thereof is determined by the claims that follow.

What is claimed is:

1. A semiconductor device, comprising:
    a first circuit and a second circuit formed in a semiconductor substrate;
    a first guard structure formed in the semiconductor substrate and disposed between the first circuit and the second circuit, the first guard structure including first discontinuous pairs of n+ and p+ diffusions of substantially the same size disposed along a first axis; and
    a second guard structure formed in the semiconductor substrate and disposed between the first circuit and the second circuit, the second guard structure including second discontinuous pairs of n+ and p+ diffusions of substantially the same size disposed along the first axis and adjacent to the first discontinuous pairs of n+ and p+ diffusions along a second axis perpendicular to the first axis, each second discontinuous pair of n+ and p+ diffusions overlapping two of the first discontinuous pairs of n+ and p+ diffusions.

2. The semiconductor device of claim 1, wherein the first guard structure includes a first continuous diffusion extending along the second axis perpendicular with the first axis, and the second guard structure includes a second continuous diffusion extending along the second axis.

3. The semiconductor device of claim 2, wherein the first guard structure is a first guard ring formed around the first circuit, the first guard ring including first and second sides formed by respective first and second sets of the first discontinuous n+ and p+ diffusions and second and third sides formed by respective first and second portions of the first continuous diffusion.

4. The semiconductor device of claim 3, wherein the second guard structure is a second guard ring formed around the first guard ring, the second guard ring including first and second sides formed by respective first and second sets of the second discontinuous n+ and p+ diffusions and second and third sides formed by respective first and second portions of the second continuous diffusion.

5. The semiconductor device of claim 1, further comprising:
    a moat between the first discontinuous pairs of n+ and p+ diffusions and the second discontinuous pairs of n+ and p+ diffusions.

6. The semiconductor device of claim 1, further comprising:
    a deep well formed in the semiconductor substrate and disposed between the first discontinuous pairs of n+ and p+ diffusions and the second discontinuous pairs of n+ and p+ diffusions.

7. The semiconductor device of claim 1, wherein the semiconductor substrate comprises a p-type substrate, and wherein the first and second guard structures are formed in the p-type substrate.

8. The semiconductor device of claim 1, wherein a well is formed in the substrate, and wherein the first and second guard structures are formed in the well.

9. The semiconductor device of claim 1, wherein the first discontinuous pairs of n+ and p+ diffusions include first gaps and the second discontinuous pairs of n+ and p+ diffusions include second gaps, and wherein the first gaps are not aligned along a second axis perpendicular to the first axis.

10. The semiconductor device of claim 1, wherein, for each of the first discontinuous pairs of n+ and p+ diffusions, the n+ diffusion is staggered with respect to the p+ diffusion.

11. The semiconductor device of claim 1, further comprising:
    a third guard structure formed in the semiconductor substrate and disposed between the first circuit and the second circuit, the third guard structure including third discontinuous pairs of n+ and p+ diffusions disposed along the first axis, the third discontinuous pairs of n+ and p+ diffusions being staggered with respect to the second discontinuous pairs of n+ and p+ diffusions.

12. A method of manufacturing a semiconductor device, comprising:
    forming a first circuit and a second circuit in a semiconductor substrate;
    forming a first guard structure in the semiconductor substrate between the first circuit and the second circuit, the first guard structure including first discontinuous pairs of n+ and p+ diffusions of substantially the same size disposed along a first axis; and
    forming a second guard structure in the semiconductor substrate between the first circuit and the second circuit, the second guard structure including second discontinuous pairs of n+ and p+ diffusions of substantially the same size disposed along the first axis and adjacent to the first discontinuous pairs of n+ and p+ diffusions along a second axis perpendicular to the first axis, each second discontinuous pair of n+ and p+ diffusions overlapping two of the first discontinuous pairs of n+ and p+ diffusions.

13. The method of claim 12, wherein the first guard structure includes a first continuous diffusion extending along the second axis perpendicular with the first axis, and the second guard structure includes a second continuous diffusion extending along the second axis.

14. The method of claim 13, wherein the first guard structure is a first guard ring formed around the first circuit, the first guard ring including first and second sides formed by respective first and second sets of the first discontinuous n+ and p+ diffusions and second and third sides formed by respective first and second portions of the first continuous diffusion.

15. The method device of claim 14, wherein the second guard structure is a second guard ring formed around the first guard ring, the second guard ring including first and second sides formed by respective first and second sets of the second discontinuous n+ and p+ diffusions and second and third sides formed by respective first and second portions of the second continuous diffusion.

16. The method of claim 12, further comprising:
    forming a moat between the first discontinuous pairs of n+ and p+ diffusions and the second discontinuous pairs of n+ and p+ diffusions.

17. The method of claim 12, further comprising:
    forming a deep well in the semiconductor substrate and disposed between the first discontinuous pairs of n+ and p+ diffusions and the second discontinuous pairs of n+ and p+ diffusions.

18. The method of claim 12, wherein the semiconductor substrate comprises a p-type substrate, and wherein the first and second guard structures are formed in the p-type substrate.

19. The method of claim 12, wherein a well is formed in the substrate, and wherein the first and second guard structures are formed in the well.

20. The method of claim 12, wherein the first discontinuous pairs of n+ and p+ diffusions include first gaps and the second discontinuous pairs of n+ and p+ diffusions include second gaps, and wherein the first gaps are not aligned along a second axis perpendicular to the first axis.

\* \* \* \* \*